(12) United States Patent
Choe et al.

(10) Patent No.: US 7,071,731 B1
(45) Date of Patent: Jul. 4, 2006

(54) PROGRAMMABLE LOGIC WITH PIPELINED MEMORY OPERATION

(75) Inventors: Kok Heng Choe, Penang (MY); Edwin Yew Fatt Kok, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/905,831

(22) Filed: Jan. 21, 2005

(51) Int. Cl.
*G06F 7/38* (2006.01)
*G11C 7/10* (2006.01)

(52) U.S. Cl. .............................. 326/40; 326/93; 326/41; 365/189.01; 365/189.02

(58) Field of Classification Search .................. 326/39, 326/40, 41, 46, 47, 93; 365/189.01, 189.02
See application file for complete search history.

(56) References Cited

U.S. PATENT DOCUMENTS 6,600,693 B1 * 7/2003 Kim ............................ 365/233
6,870,856 B1 * 3/2005 Schroth ...................... 370/466

* cited by examiner

*Primary Examiner*—Daniel Chang
(74) *Attorney, Agent, or Firm*—Townsend and Townsend and Crew, LLP

(57) ABSTRACT

Memory performance of an integrated circuit, such as a programmable logic integrated circuit, is increased by pipelining. In a single clock cycle, more than one operation may be performed on the memory, which improves bandwidth. In an implementation, the memory architecture having one port supports pipelining, so reading from and writing to the memory can be accomplished in a one clock cycle and both Read and Write operation can occupy the full clock cycle at the same time on the same port. The pipelining architecture has relatively minimal circuit changes compared to a standard memory architecture which not supporting simultaneous-clock-cycle reads and writes, without requiring two or more ports.

20 Claims, 6 Drawing Sheets

Pipelined Architecture - Enable both Read/Write operation to occupy full cycle on one clock period at Port A Typical Memory - Single operation on one clock period at Port A Typical Memory - Read/Write operation occupying half clock cycle at Port A Pipelined Architecture - Enable both Read/Write operation to occupy full cycle on one clock period at Port A

PROGRAMMABLE LOGIC WITH PIPELINED MEMORY OPERATION

BACKGROUND OF THE INVENTION

The invention relates generally to the field of integrated circuits and in particular, to programmable logic integrated circuits. More specifically, the invention provides increased bandwidth operation for on-chip memory of a programmable logic integrated circuit.

Integrated circuits are important building blocks of the modern age. Technology continues to evolve and integrated circuits continue to provide improved functionality. As integrated circuits improve, so do the electronics systems that are built using integrated circuits. There are many types of integrated circuits such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, look-up tables, and combinations of these. Programmable logic integrated circuits also include embedded user-programmable memory or RAM.

Despite the success of programmable logic, there is a continuing desire to provide higher performance and greater functionality in programmable logic integrated circuits. For example, it is desirable to provide higher performance memory operations in a programmable logic integrated circuit. In other words, more memory operations, such as reading or writing, or both, may be performed in a given time. Faster data storage and retrieval from the programmable logic memory facilitates higher performance electronic systems.

Therefore, there is a need to provide techniques and circuitry to improve the performance of memories in an integrated circuit, especially in programmable logic integrated circuits.

SUMMARY OF THE INVENTION

Memory performance of an integrated circuit, such as a programmable logic integrated circuit, is increased by pipelining. In a single clock cycle, more than operation may be performed on the memory, which improves bandwidth. In an implementation, the memory architecture having one port supports pipelining, so reading from and writing to the memory may be accomplished in one clock cycle. The pipelining architecture has relatively minimal circuit changes compared to a standard memory architecture which does not support simultaneous-clock-cycle reads and writes without two or more ports.

In an implementation of the invention, a programmable logic integrated circuit is operated so that in a first portion of a clock cycle, write data is transferred through a multiplexer-demultiplexer circuit to a write driver latch. During the same first portion of the clock cycle, read data stored in a memory cell of a random access memory is also retrieved or read. In second portion of the clock cycle, data from the write driver latch is written in a memory cell of the random access memory. This memory cell may be different from the memory cell which is read from, or may be the same memory cell. During the second portion of the clock cycle, the read data is transferred to an output register, where it can be programmably connected to other circuitry of the programmable logic, or to circuitry outside the integrated circuit.

In another implementation of the invention, the invention is a programmable logic integrated circuit having a memory block with a random access memory and a multiplexer-demultiplexer circuit. The memory block permits reading and writing to the memory in a single clock cycle. When reading, the read data passes from the random access memory through the multiplexer-demultiplexer circuit. When writing, the write data passes through the multiplexer-demultiplexer circuit to the random access memory. The circuitry adjusts timing of the read data and write data so they do not conflict with each other. For example, the read data and write data will not be in the multiplexer-demultiplexer circuit at exactly the same time period of the clock cycle.

Other objects, features, and advantages of the present invention will become apparent upon consideration of the following detailed description and the accompanying drawings, in which like reference designations represent like features throughout the figures.

DETAILED DESCRIPTION

Figure 1:
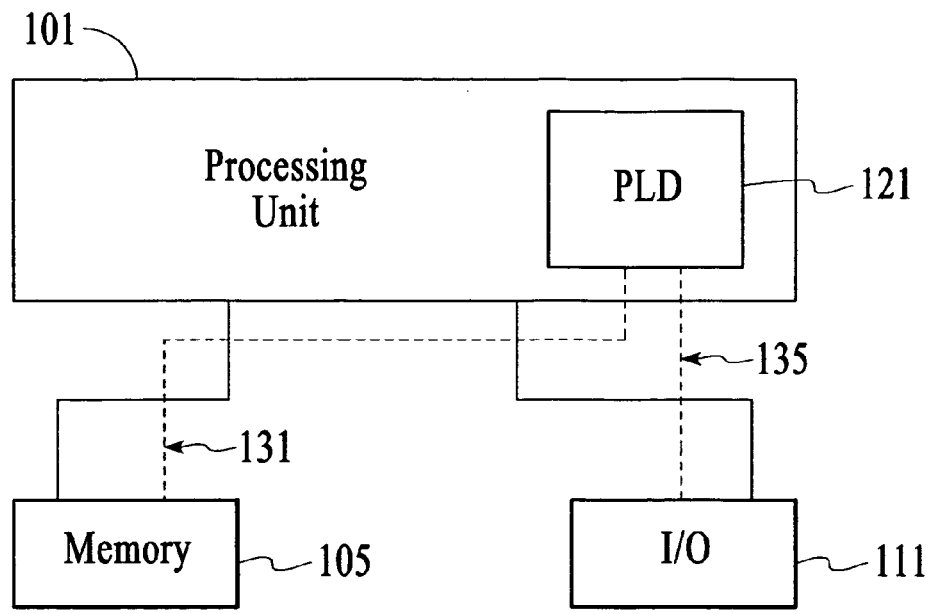
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, Hardcopy®, FLEX®, APEX™, and STRATIX® series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
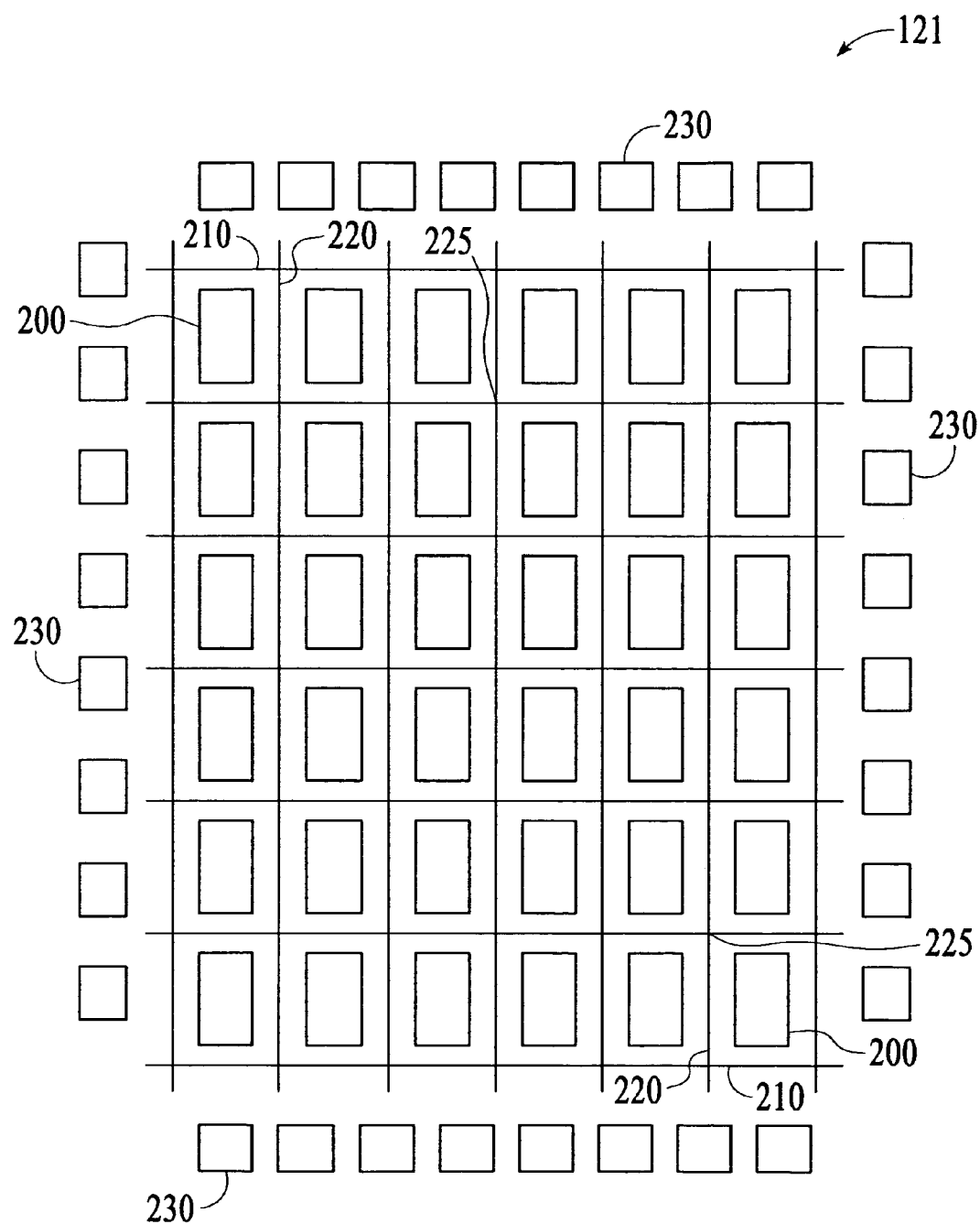
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
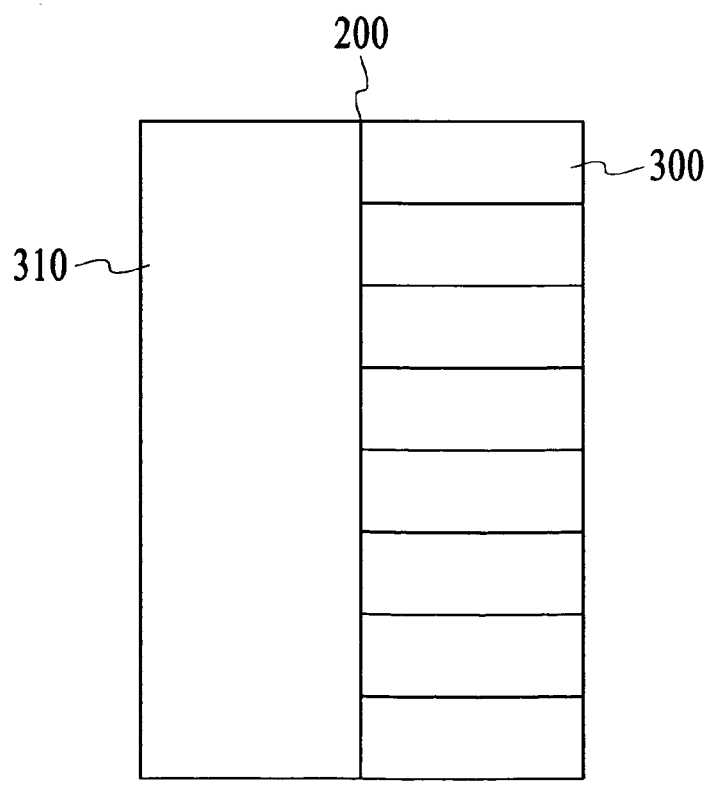
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
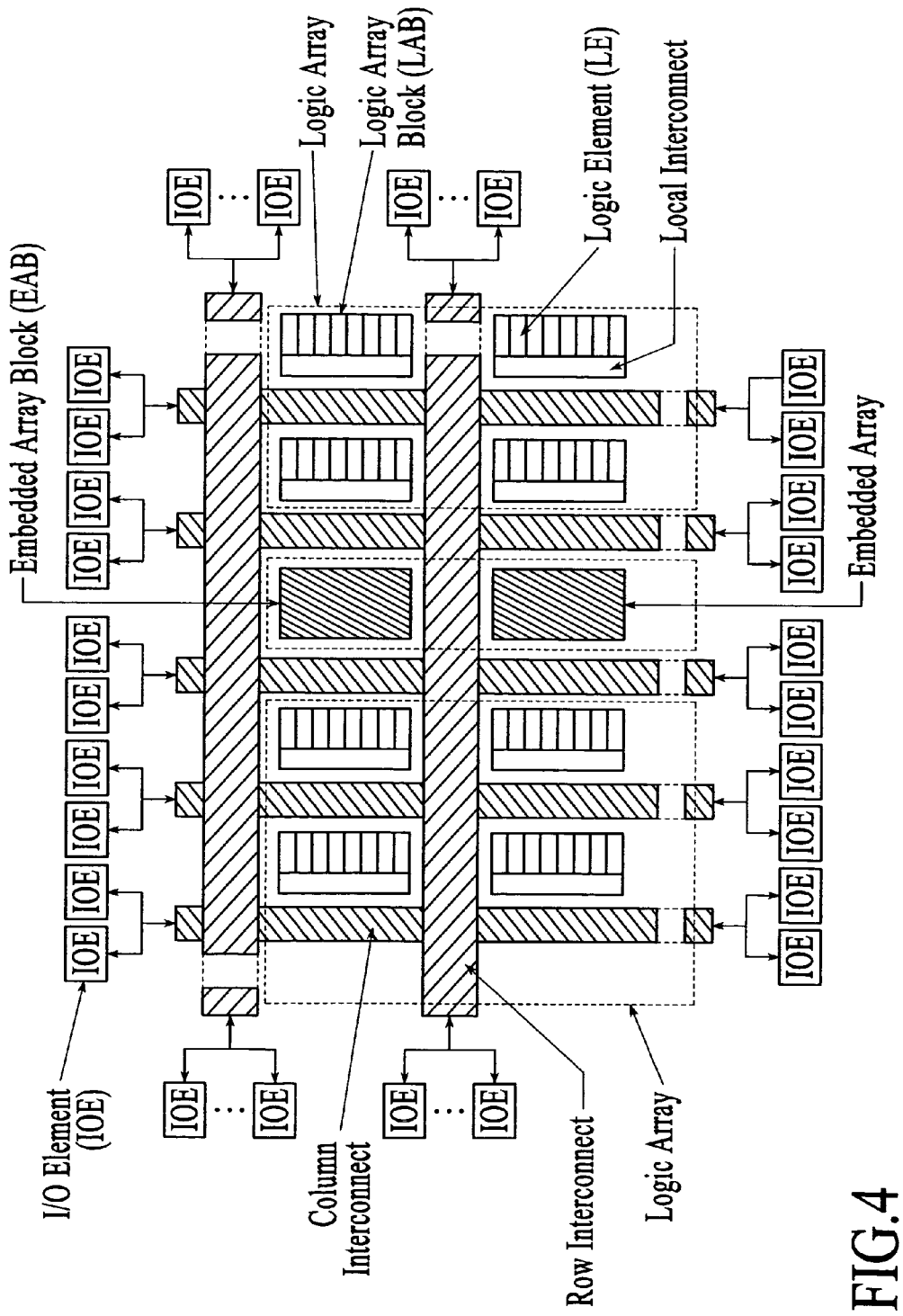
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX® family of products are described in detail in the their respective data sheets, available via the Internet at www.altera.com.

Figure 5:
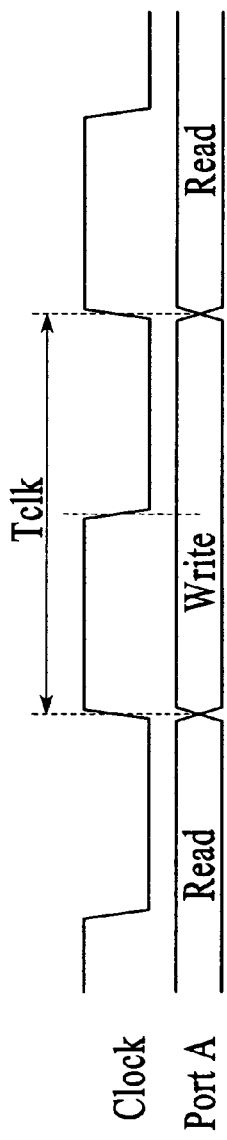
FIG. 5 shows a timing diagram for read and write operation of a memory in a programmable logic integrated circuit, where a read operation or a write operation is performed in one clock cycle.

FIG. 5 shows a timing diagram for read and write operation of a memory in a programmable logic integrated circuit, where a read operation or a write operation is performed in different clock cycle. For a read operation, data is read or retrieved out of the memory. For a write operation, data is written or stored in the memory in another clock cycle. The memory may be a nonvolatile or volatile memory. Examples of nonvolatile memory include memories with Flash or EEPROM cells. Examples of volatile memory include SRAM and DRAM.

In FIG. 5, a read operation takes one clock cycle, and a write operation takes one clock cycle. The read or write operation takes place at a port A of the memory. A time TCLK is one clock period. In operation of a memory according to this figure, either a read or write operation may occur in a time TCLK.

Figure 6:
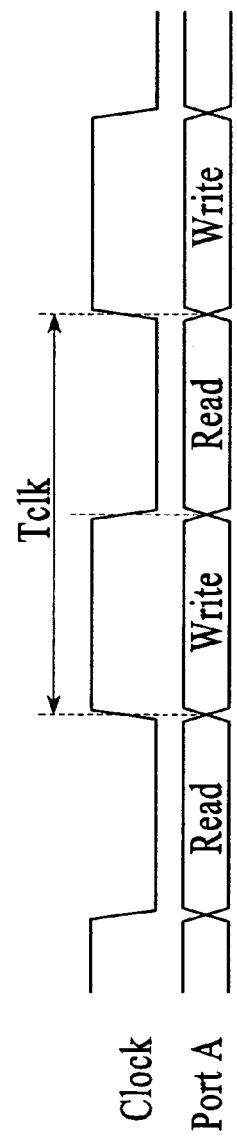
FIG. 6 shows another timing diagram for read and write operation of a memory in a programmable logic integrated circuit, where a read and write operation are performed in a single clock cycle.

FIG. 6 shows another timing diagram for read and write operation of a memory in a programmable logic integrated circuit, where a read and write operation are performed in a single clock cycle. Compared to FIG. 5, both read and write operation occur in a single clock cycle through a port A. Therefore, an integrated circuit operating according to this timing diagram has twice the memory bandwidth as in FIG. 5.

Note that for this figure, the duty cycle of the clock is about 50 percent, which means the clock is high 50 percent of the clock period and off 50 percent of the clock period. This gives approximately equal times for the read and write operations. In other words, the read and write operation each occupies half of a clock cycle at port A. In the embodiment of this figure, a designer should consider the duty cycle of the clock in order to give adequate times to complete the read and write operation, so that functional errors will not occur.

In other embodiments, the duty cycle is not necessarily 50 percent, but other percentages, such as 25, 30, 40, 45, 46, 47, 48, 49, 51, 52, 53, 54, 55, 60, and 75. For example, a memory write operation may take longer than a memory read operation, and then the duty cycle may be greater than 50 percent. When a memory write operation takes less time than a memory read operation, the duty cycle may be less than 50 percent.

Figure 7:
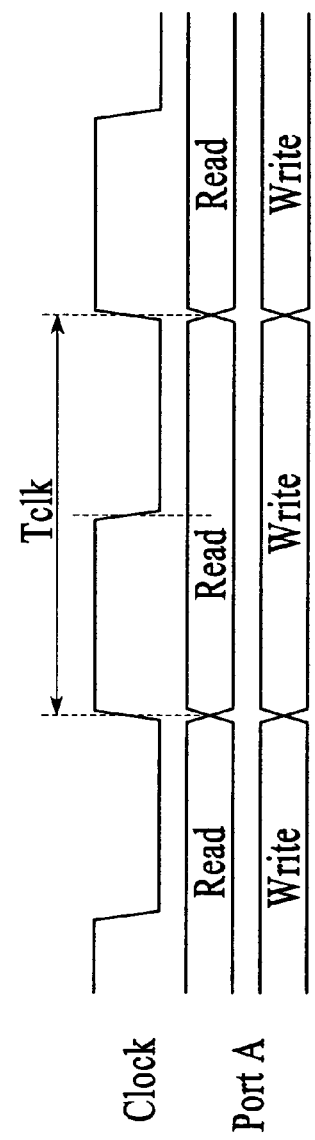
FIG. 7 shows another timing diagram for read and write operation of a memory in a programmable logic integrated circuit, where the read and write memory operations are pipelined.

FIG. 7 shows another timing diagram for read and write operation of a memory in a programmable logic integrated circuit, where the read and write memory operations are pipelined. Using a port A, a read and write operation are performed in single clock cycle. This is somewhat similar to the situation discussed in FIG. 6, but in this case, the full clock period time is available to the read operation and the write operation, not simply half a clock cycle as in FIG. 6.

Operating a memory according to this figure allows even higher performance than in FIG. 6 because read and writes may occur at the same time or simultaneously with each other. The clock-to-output or TCO time is not increased. Therefore, the TCLK or clock period of this embodiment may be shorter than in the previous embodiments. This means a high clock frequency, and thus higher performance. This embodiment may provide twice the bandwidth or greater than that in FIG. 6.

Figure 8:
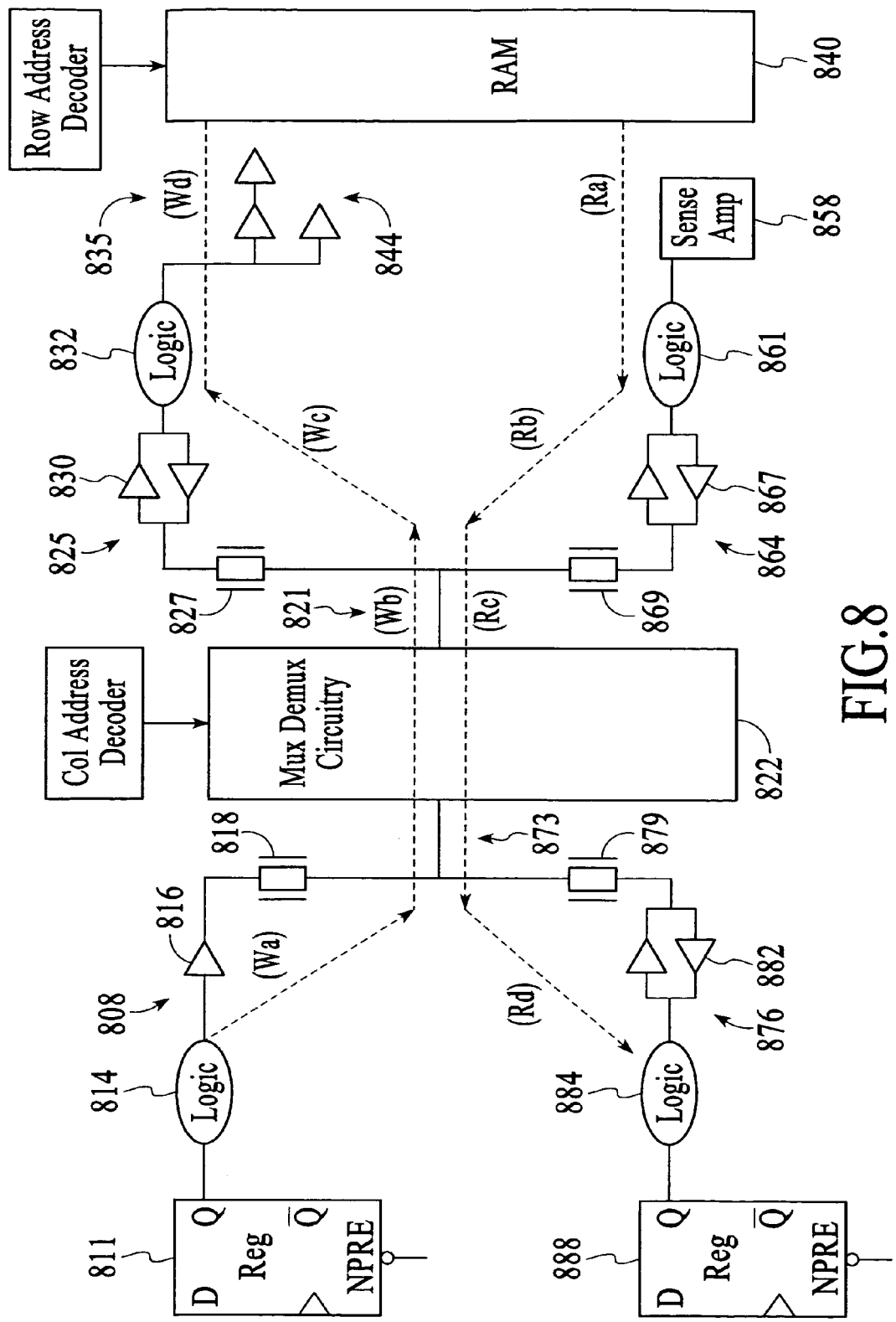
FIG. 8 shows a circuit diagram of an embodiment a pipelined memory architecture.

FIG. 8 shows a circuit diagram of a pipelined memory architecture. Using this architecture, the memory may be read from and written to according to the timing diagram of FIG. 7. The circuitry in FIG. 8 may be incorporated in an EAB of a programmable logic integrated circuit, to permit pipelined operation. In other embodiments, some components of the circuitry in FIG. 8 may be implemented using LABs or outside an EAB. For example, two or more EABs may share circuitry to allow the pipelining of the invention.

In an implementation, the memory architecture has one port and supports pipelining, so reading from and writing to the memory may be accomplished in a one clock cycle. The pipelining architecture has relatively minimal circuit changes compared to a standard memory architecture which not supporting simultaneous-clock-cycle reads and writes, without requiring two or more ports. The circuitry in FIG. 8 is provided merely an example of a pipelined memory architecture of the invention, and there are many other variations and embodiments of the invention.

The memory data path is pipelined into three independent but interrelated sections by latches and multiplexers (or muxes) in both a read and write data path. Specifically, a first portion 808 of a write data path includes a D flip-flop 811, logic 814, buffer 816, and transmission gate 818. A flip-flop may also be referred to as a register. Logic may be any logic, such as combinatorial logic, NAND, NOR, AND, OR, look-up table, product term, wired OR, or straight wire, or combinations of these. The buffer may be implemented using inverting or noninverting buffers, such as a single inverter or two inverters in series. The logic and the buffer may be implemented using a combined circuit. For example, a NAND logic gate may be used both as logic and to also provide buffering capability. The transmission gate may be a pass gate, fully complementary transmission gate such as a CMOS transmission gate, NMOS pass gate, PMOS pass gate, or any combination of these in the pipelining circuit.

A second portion 821 of the write data path passes through multiplexer-demultiplexer circuitry 822. A column address decoder connects to the multiplexer-demultiplexer circuitry to select a column of the memory. A third portion 825 of the write data path includes a transmission gate 827, latch 830, and logic 832. A fourth portion 835 of the write data path includes drivers or buffers that are connected to a memory or RAM 840. There may be write drivers 844 to provide the true or complement of the data signals, or both, to the RAM. A row address decoder is connected to the RAM to select the proper row address to write (or read) data to.

The RAM may have any organization of memory cells. For example, the memory cells of the RAM may be organized in rows and columns. Rows of memory cells are connected using row lines, and columns of memory cells are connected using bit lines.

Similarly there is a read path for the memory. A first portion 858 of the read path is from the RAM through a sense amplifier, which determines the state of the memory, and logic 861. A second portion 864 of the read path includes a latch 867 and a transmission gate 869. A third portion 873 of the read path passes through the multiplexer-demultiplexer circuitry. A fourth portion 876 of the read path includes a transmission gate 879, latch 882, logic 884, and D flip-flop 888.

This architecture will permit the read and write operations to occur at the same time in different sections accordingly. Memory operation consists of several events. A read and write operation has its own sets of event. Events for read and write happen sequentially one after another. A write event begins from the input register (i.e., D flip-flop 811) to the RAM cell (i.e., a cell in RAM 840). However, a read operation occurs in opposite direction. A read operation begins from a RAM cell read to output register (i.e., D flip-flop 888).

Note that read and write data travel in opposite directions. In this particular figure, for a read operation, data moves from the RAM to the output register, which is left to right. And for a write operation data moves from the input register to the RAM, which is from left to right. The pipelining technique of the invention takes advantage of this opposite sequence of events to permit reading and writing at the same time, with separate circuit paths where needed.

Due to this opposite event sequence behavior that happens one at a time, a pipelining architecture, such as the example in FIG. 8, is a way to perform both read and write operations at the same time (i.e., same clock cycle), thus increasing the memory operational bandwidth.

The following is a more detailed description of the read and write operations of the pipelining architecture. In a first operational step, referring to the pipelined data path diagram shown, a write operation will begin with input data preparation. Input data to be written, held in register 811, is output from register 811 and input to multiplexer-demultiplexer circuitry 882. Column address decoding for the write column is also occurring. During this time, the read operation decodes the row address to enable a specific RAM cell to be read.

In a second operational step, the write operation will utilize multiplexer-demultiplexer circuitry 822 to send the input data to write driver 844. The data will be latched using latch 830 and the multiplexer-demultiplexer circuitry will be released for read operation usage. At this time, the RAM is pulling the bit line (not shown) of the memory to create bit line voltage difference. The RAM data will be sensed by sense amp 858 and sent to read output latch 867. The bit line and RAM usage for read operation is completed at this time.

In a third operational step, the write operation will take over the bit line and RAM by writing the input data. Precharge will occur after write operation completes. The read operation will utilize the multiplexer-demultiplexer circuitry path to send the read data to output register 888.

In an implementation, the invention is a method of operating a programmable logic integrated circuit. In a first portion of a clock cycle, write data is transferred through a multiplexer-demultiplexer circuit to a write driver latch. In the first portion of the clock cycle, read data stored in a memory cell of a random access memory is retrieved or read. In a second portion of the clock cycle, data from the write driver latch is written in a memory cell of the random access memory. In a second portion of the clock cycle, the read data is transferred to an output register.

In a third portion of the clock cycle, a row address of the random access memory of the memory cell to be retrieved may be decoded. In the third portion of the clock cycle, a column of the random access memory of the memory cell to be written may be decoded. When retrieving read data stored in a memory cell of a random access memory, this may include sensing the memory cell of the random access memory using a sense amplifier circuit.

In an implementation, the invention is a method of operating a programmable logic integrated circuit by providing a multiplexer-demultiplexer circuit in an enhanced array block of the programmable logic integrated circuit. The multiplexer-demultiplexer circuit is connected between a memory array, input port, and output port of the enhanced array block. In a clock cycle, write data is transferred from the input port through the multiplexer-demultiplexer circuit to the memory array. In the clock cycle, read data is transferred from the memory array through the multiplexer-demultiplexer circuit to the output port. The write data may be stored into the memory array.

The write data and read data may be transferred through the multiplexer-demultiplexer circuit at different time periods of the clock cycle. The clock cycle may have about a fifty percent duty cycle, or another duty cycle percentage in other implementations.

Furthermore, a first write branch circuit of the enhanced array block may be connected between the multiplexer-demultiplexer circuit and the input port. A second write branch circuit of the enhanced array block may be connected between the multiplexer-demultiplexer circuit and the memory array. A first read branch circuit of the enhanced array block may be connected between memory array and the multiplexer-demultiplexer circuit. A second read branch circuit of the enhanced array block may be connected between the multiplexer-demultiplexer circuit and the output port.

During a first period of the clock cycle, the write data is in the first write branch circuit, and the read data is in the first read branch circuit. During a second period of the clock cycle, the write data is in the multiplexer-demultiplexer circuit, and the read data the first read branch circuit. During a third period of the clock cycle, the write data is in the second write branch circuit, and the read data is in the multiplexer-demultiplexer circuit. During a fourth period of the clock cycle, the write data is in the second write branch circuit, and the read data is in the second read branch circuit.

In an implementation, the invention is a programmable logic integrated circuit having a first programmable interconnect conductors arranged in a first direction and second programmable interconnect conductors arranged in a second direction, different from the first direction. There are logic array blocks, programmably connected to the first and second programmable interconnect conductors. Enhanced array blocks are programmably connected to the first and second programmable interconnect conductors.

Each of the enhanced array blocks has a write input register; a multiplexer-demultiplexer circuit, connected to the write input register; a write latch, connected to write input register through the multiplexer-demultiplexer circuit; and a write driver, connected to the write latch. Each enhanced array block further includes a random access memory, connected to the write driver; a sense amplifier circuit, connected to the random access memory; a first read latch, connected to the sense amplifier circuit; a second read latch, connected to the first read latch through the multiplexer-demultiplexer circuit; and a read output register, connected to the second read latch.

In an implementation, there is a first pass gate connected between the write input register and the multiplexer-demultiplexer circuit and a second pass gate connected between the multiplexer-demultiplexer circuit and the write latch. There may be a third pass gate connected between the first read latch and the multiplexer-demultiplexer circuit and a fourth pass gate coupled between the multiplexer-demultiplexer circuit and the second latch. The pass gates may be pass transistors, transmission gates, switches, and other circuits or components that implement a pass gate function.

In an implementation, the invention is an integrated circuit having a programmable interconnect structure to conduct logic signals, a clock signal line, and logic array blocks, programmably connected to the programmable interconnect structure, each logic array block having user-configurable logic. There is a memory block, programmably connected to the clock signal line and the programmable interconnect structure. The memory block has a random access memory and a multiplexer-demultiplexer circuit block. In a first cycle of a clock signal on the clock signal line, write data is written to the random access memory and read data is read from the random access memory.

Figure 9:
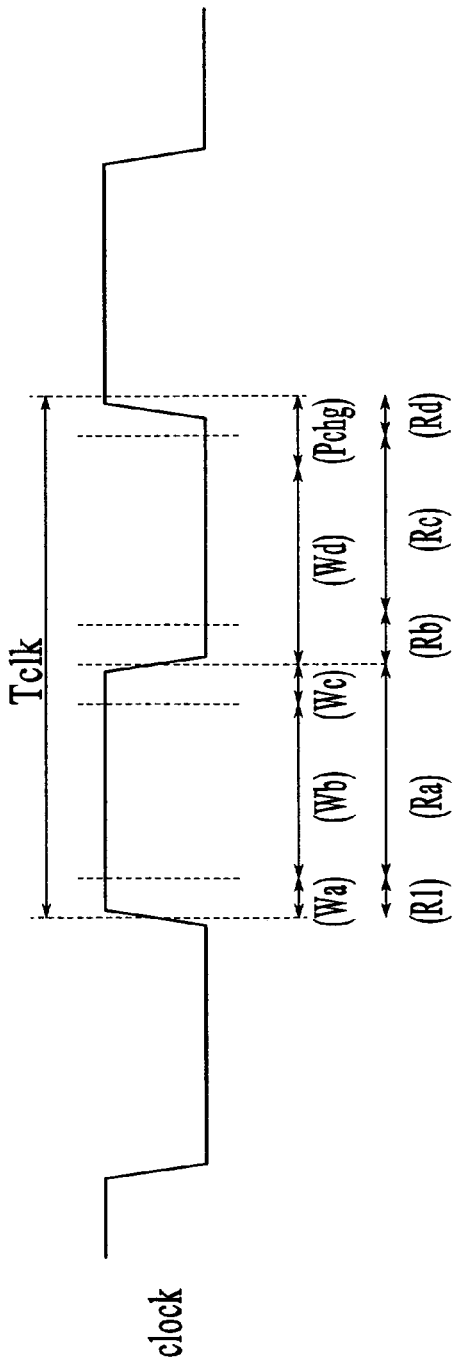
FIG. 9 shows a timing diagram for pipelined operation of the pipelined memory architecture.

FIG. 9 shows a timing diagram for pipelined operation of the circuitry in FIG. 8. This timing diagram summarizes the timing budget for the pipelined data path utilization and read and write operation sequence.

For the read operation, R1 is a time for read row address decoding. Ra is a time for build bit line voltage difference and sense RAM content. Rb is a time for margin for pass gate for sense amp latch to data path and read column address decoding. Rc is a time for read data sent to output register. Rd is a margin for pass gate for data path to output register latch. FIG. 8 has arrows Ra, Rb, Rc, and Rd indicating the corresponding circuit paths for these timing parameters.

For the write operation, Wa is a time for input data clock-to-output (TCO) and write column decoding delay. Wb is a time for write data sent to write driver latch. Wc is a time for margin for pass gate for data path to write driver latch. Wd is a time for write data into RAM. FIG. 8 has arrows Wa, Wb, Wc, and Wd indicating the corresponding circuit paths for these timing parameters.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method of operating a programmable logic integrated circuit comprising:

in a first portion of a clock cycle, transferring write data through a multiplexer-demultiplexer circuit to a write driver latch;

in the first portion of the clock cycle, retrieving read data stored in a memory cell of a random access memory;

in a second portion of the clock cycle, writing the write data from the write driver latch into a memory cell of the random access memory; and in the second portion of the clock cycle, transferring the read data to an output register.

2. The method of claim 1 wherein the retrieving read data stored in a memory cell of a random access memory comprises sensing the memory cell of the random access memory using a sense amplifier circuit.

3. The method of claim 1 further comprising:

in a third portion of the clock cycle, decoding a row address of the random access memory of the memory cell to be retrieved; and in the third portion of the clock cycle, decoding a column address of the random access memory of the memory cell to be written.

4. A method of operating a programmable logic integrated circuit comprising:

providing a multiplexer-demultiplexer circuit in an enhanced array block of the programmable logic integrated circuit, wherein the multiplexer-demultiplexer circuit is coupled between a memory array, input port, and output port of the enhanced array block;

in a clock cycle, transferring write data from the input port through the multiplexer-demultiplexer circuit to the memory array; and in the clock cycle, transferring read data from the memory array through the multiplexer-demultiplexer circuit to the output port wherein at least in a portion of the clock cycle, transferring at least some of the write data and transferring at least some of the read data occur simultaneously.

5. The method of claim 4 wherein the write data is stored into the memory array.

6. The method of claim 4 wherein the write data and read data are transferred through the multiplexer-demultiplexer circuit at different time periods of the clock cycle.

7. The method of claim 4 wherein the clock cycle has about a fifty percent duty cycle.

8. The method of claim 4 further comprising:

providing a first write branch circuit of the enhanced array block coupled between the multiplexer-demultiplexer circuit and the input port;

providing a second write branch circuit of the enhanced array block coupled between the multiplexer-demultiplexer circuit and the memory array;

providing a first read branch circuit of the enhanced array block coupled between memory array and the multiplexer-demultiplexer circuit; and providing a second read branch circuit of the enhanced array block coupled between the multiplexer-demultiplexer circuit and the output port.

9. The method of claim 8 wherein during a first period of the clock cycle, the write data is in the first write branch circuit, and the read data is in the first read branch circuit, during a second period of the clock cycle, the write data is in the multiplexer-demultiplexer circuit, and the read data the first read branch circuit, during a third period of the clock cycle, the write data is in the second write branch circuit, and the read data is in the multiplexer-demultiplexer circuit, and during a fourth period of the clock cycle, the write data is in the second write branch circuit, and the read data is in the second read branch circuit.

10. A programmable logic integrated circuit comprising:
a plurality of first programmable interconnect conductors arranged in a first direction;
a plurality of second programmable interconnect conductors arranged in a second direction, different from the first direction;
a plurality of logic array blocks, programmably coupled to the first and second programmable interconnect conductors; and
a plurality of enhanced array blocks, programmably coupled to the first and second programmable interconnect conductors, each of the enhanced array blocks comprising:
a write input register;
a multiplexer-demultiplexer circuit, coupled to the write input register;
a write latch, coupled to write input register through the multiplexer-demultiplexer circuit;
a write driver, coupled to the write latch;
a random access memory, coupled to the write driver;
a sense amplifier circuit, coupled to the random access memory;
a first read latch, coupled to the sense amplifier circuit;
a second read latch, coupled to the first read latch through the multiplexer-demultiplexer circuit; and
a read output register, coupled to the second read latch.

11. The programmable logic integrated circuit of claim 10 wherein each of the enhanced array blocks further comprises:
a column address decoder circuit, coupled to the multiplexer-demultiplexer circuit; and
a row address decoder circuit, coupled to the random access memory.

12. The programmable logic integrated circuit of claim 10 wherein each of the enhanced array blocks further comprises:
a first pass gate coupled between the write input register and the multiplexer-demultiplexer circuit; and
a second pass gate coupled between the multiplexer-demultiplexer circuit and the write latch.

13. The programmable logic integrated circuit of claim 12 wherein each of the enhanced array blocks further comprises:
a third pass gate coupled between the first read latch and the multiplexer-demultiplexer circuit; and
a fourth pass gate coupled between the multiplexer-demultiplexer circuit and the second latch.

14. The programmable logic integrated circuit of claim 10 wherein each of the enhanced array blocks further comprises:
a first pass gate coupled between the first read latch and the multiplexer-demultiplexer circuit; and
a second pass gate coupled between the multiplexer-demultiplexer circuit and the second latch.

15. An integrated circuit comprising:
a programmable interconnect structure to conduct logic signals;
a clock signal line;
a plurality of logic array blocks, programmably coupled to the programmable interconnect structure, each logic array block comprising user-configurable logic;
a memory block, programmably coupled to the clock signal line and the programmable interconnect structure, the memory block comprising a random access memory and a multiplexer-demultiplexer circuit block, wherein at least in a portion of a first cycle of a clock signal on the clock signal line, at least some write data is written to the random access memory and at least some read data is read from the random access memory simultaneously.

16. The integrated circuit of claim 15 wherein in a second cycle of the clock signal, subsequent to the first cycle, data output from a first logic array block of the plurality of logic array blocks is written to the random access memory and data read from the random access memory is input to a second logic array block of the plurality of logic array blocks.

17. The integrated circuit of claim 15 wherein the multiplexer-demultiplexer circuit block passes write data in a first direction during a first period of the first cycle of the clock signal and passes read data in a second direction, different from the first direction, during a second period of the first cycle of the clock signal.

18. The integrated circuit of claim 15 wherein the memory block further comprises:
a write input register, coupled to the multiplexer-demultiplexer circuit;
a write latch, coupled to the write input register through the multiplexer-demultiplexer circuit;
a write driver, coupled between the write latch and the random access memory;
a sense amplifier circuit, coupled to the random access memory;
a first read latch, coupled between the multiplexer-demultiplexer circuit and the sense amplifier circuit;
a second read latch, coupled to the first read latch through the multiplexer-demultiplexer circuit; and
a read output register, coupled to the second read latch.

19. The integrated circuit of claim 18 further comprising:
a first pass gate coupled between the write input register and the multiplexer-demultiplexer circuit; and
a second pass gate coupled between the multiplexer-demultiplexer circuit and the write latch.

20. The integrated circuit of claim 18 further comprising:
a third pass gate coupled between the first read latch and the multiplexer-demultiplexer circuit; and
a fourth pass gate coupled between the multiplexer-demultiplexer circuit and the second latch.

* * * * *